United States Patent
DeBar et al.

(10) Patent No.: US 9,725,306 B2
(45) Date of Patent: Aug. 8, 2017

(54) MEMS DEVICE WITH SEALED CAVITY AND METHOD FOR FABRICATING SAME

(71) Applicant: Newport Fab, LLC, Newport Beach, CA (US)

(72) Inventors: Michael J. DeBar, Tustin, CA (US); David J. Howard, Irvine, CA (US)

(73) Assignee: Newport Fab, LLC, Newport Beach, CA (US)

(*) Notice: Subject to any disclaimer, the term of this patent is extended or adjusted under 35 U.S.C. 154(b) by 131 days.

(21) Appl. No.: 14/508,145

(22) Filed: Oct. 7, 2014

(65) Prior Publication Data

US 2015/0158719 A1    Jun. 11, 2015

Related U.S. Application Data

(60) Provisional application No. 61/914,178, filed on Dec. 10, 2013.

(51) Int. Cl.
*H01L 29/84* (2006.01)
*B81C 1/00* (2006.01)

(52) U.S. Cl.
CPC ................. *B81C 1/00047* (2013.01)

(58) Field of Classification Search
CPC .................................................. B81C 1/00047
See application file for complete search history.

(56) References Cited

U.S. PATENT DOCUMENTS

2007/0138909 A1* 6/2007 Mortet et al. ............... 310/318
2009/0146227 A1* 6/2009 Igarashi ....................... 257/415

* cited by examiner

*Primary Examiner* — Jerome Jackson, Jr.
(74) *Attorney, Agent, or Firm* — Farjami & Farjami LLP

(57) ABSTRACT

Disclosed is a MEMS device having lower and upper chambers with a similar pressure and/or a similar gaseous chemistry. The MEMS device includes a top MEMS plate and a bottom MEMS plate. The MEMS device also includes a lower chamber between the bottom MEMS plate and the top MEMS plate, and an upper chamber between the top MEMS plate and a sealing layer. The top MEMS plate includes at least one segment that is narrower than the bottom MEMS plate, thereby causing the lower and upper chambers to have a similar pressure and/or a similar gaseous chemistry. In another implementation, the top MEMS plate has at least one through-hole, thereby causing the lower and upper chambers to have a similar pressure and/or a similar gaseous chemistry.

20 Claims, 17 Drawing Sheets

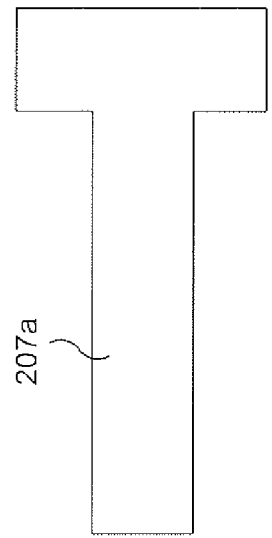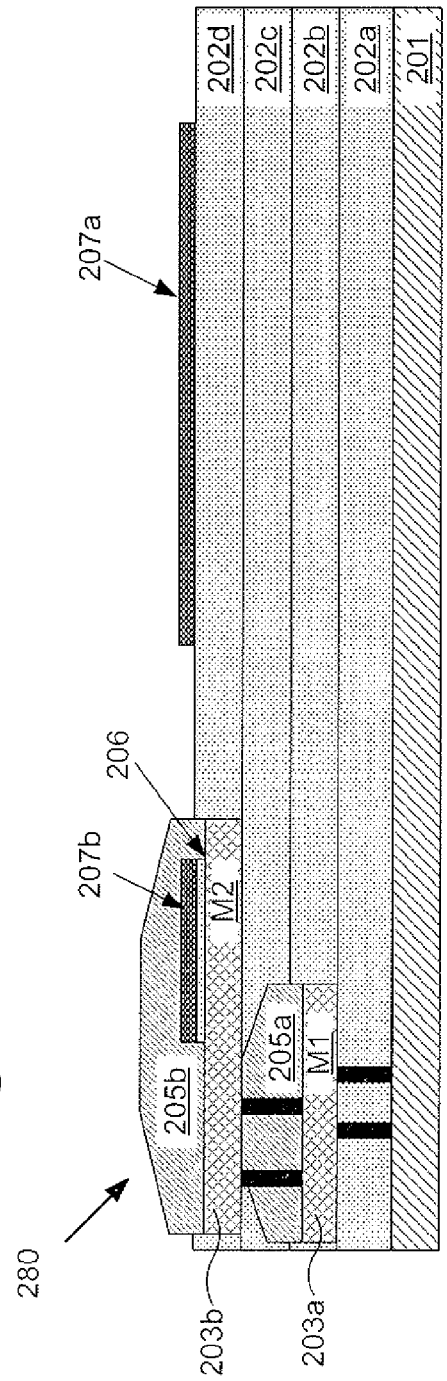
Fig. 2A-i
Fig. 2A-ii

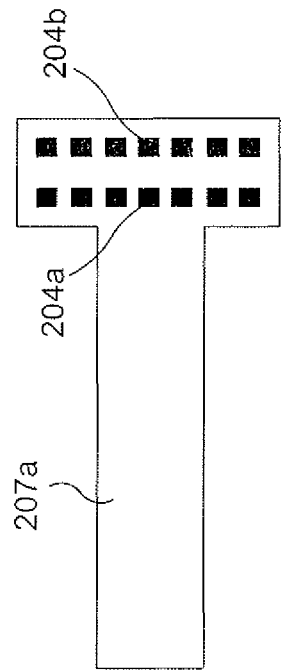
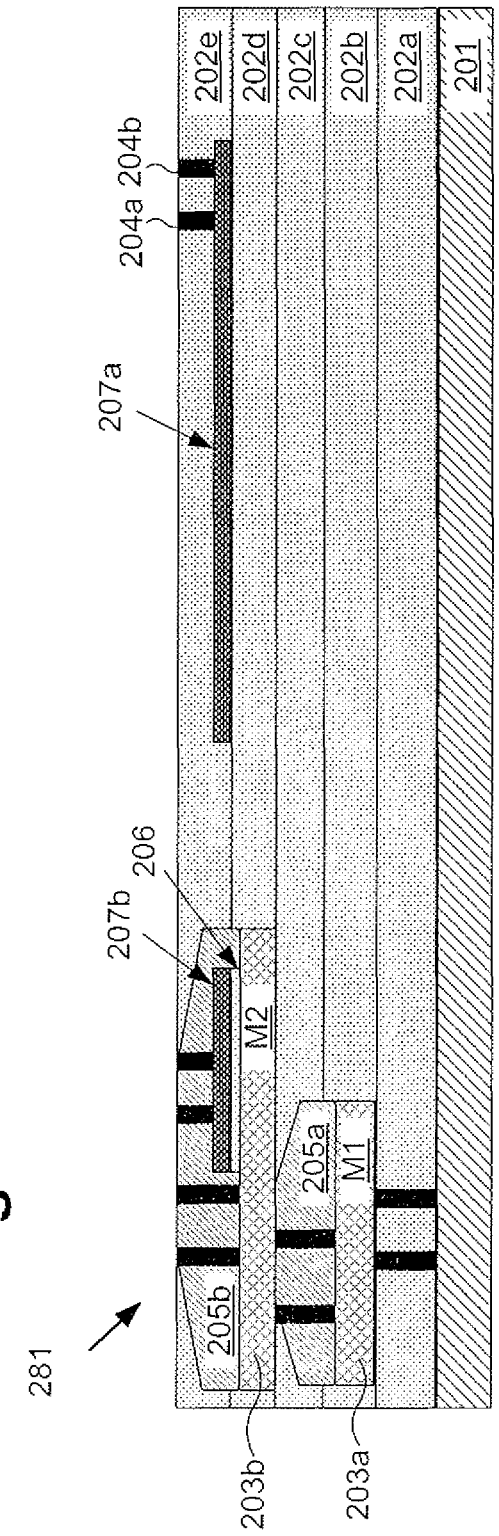
Fig. 2B-i
Fig. 2B-ii

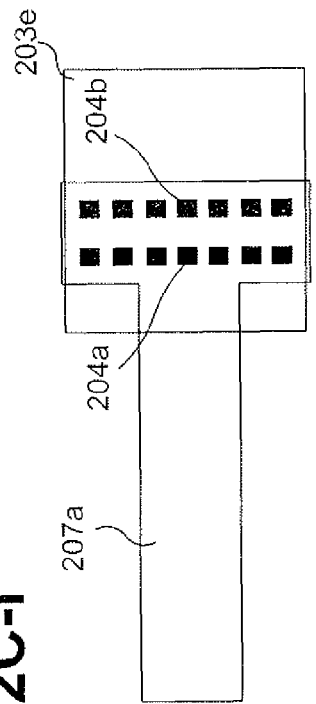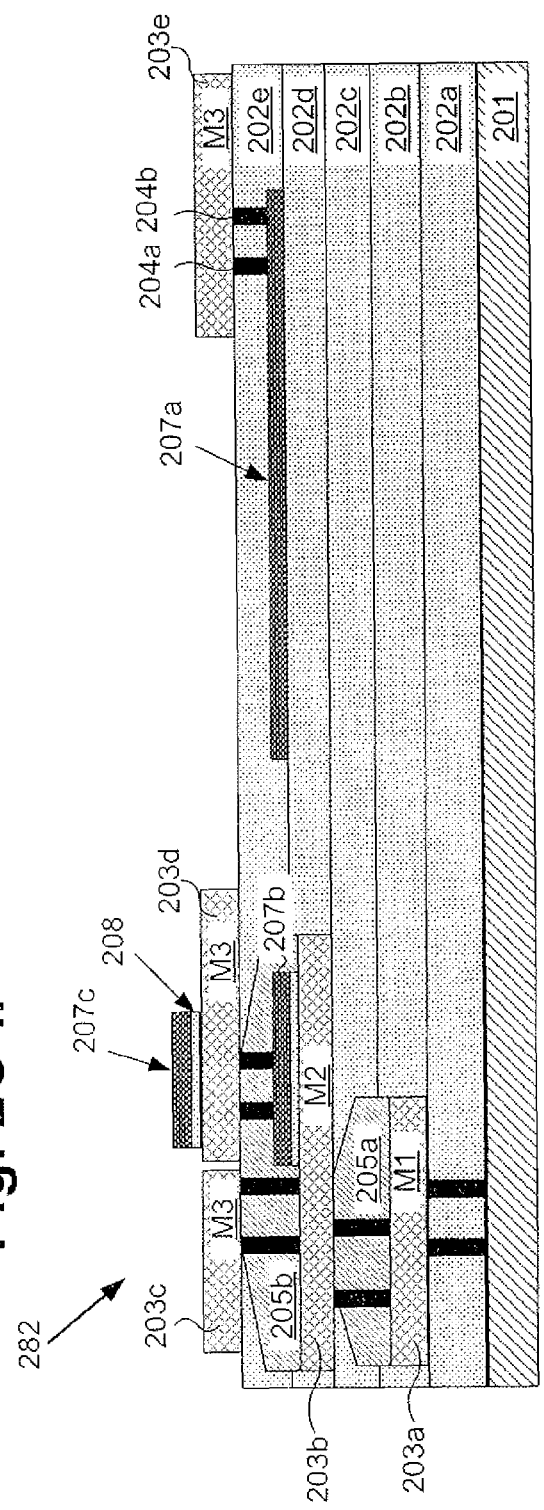
Fig. 2C-i
Fig. 2C-ii

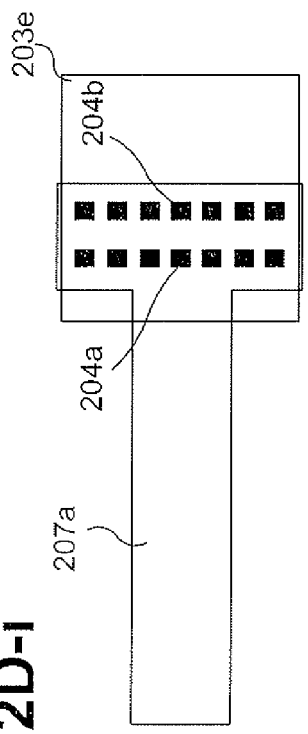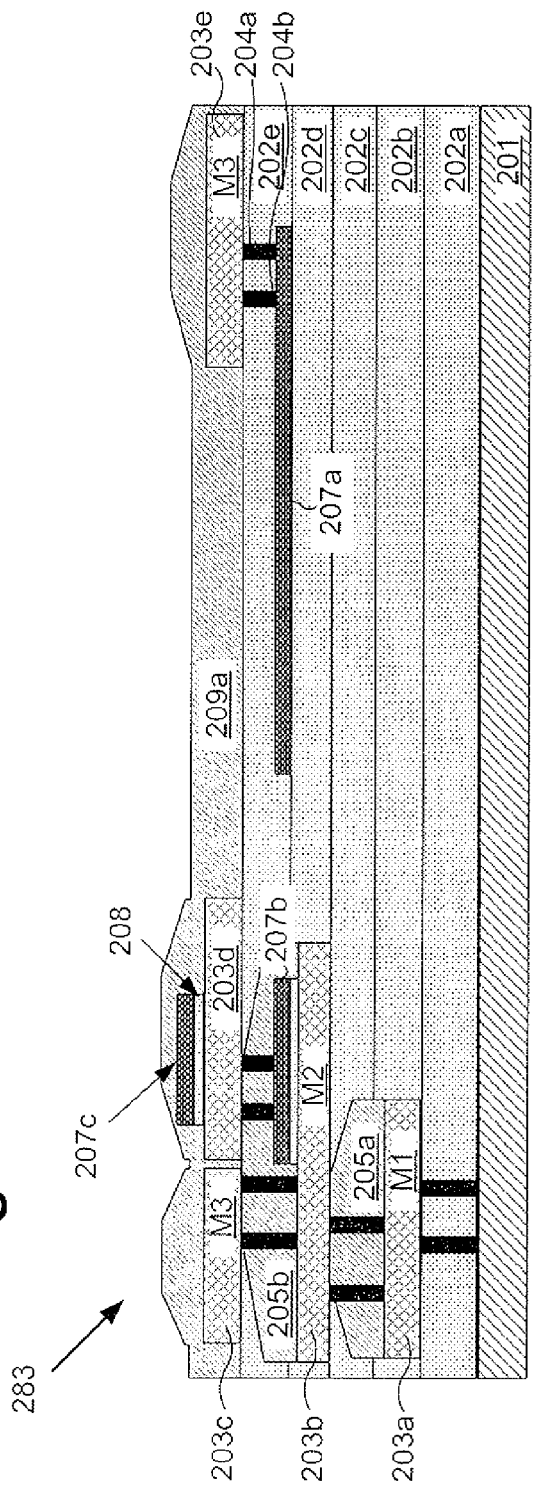
Fig. 2D-i
Fig. 2D-ii

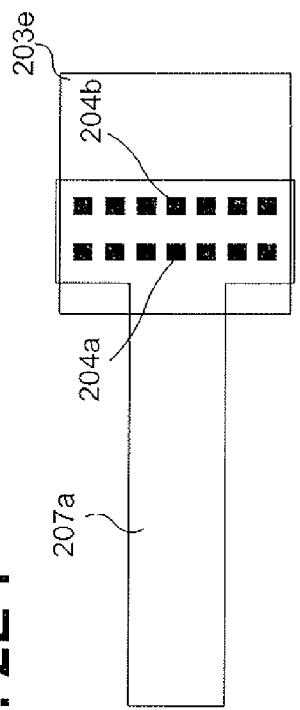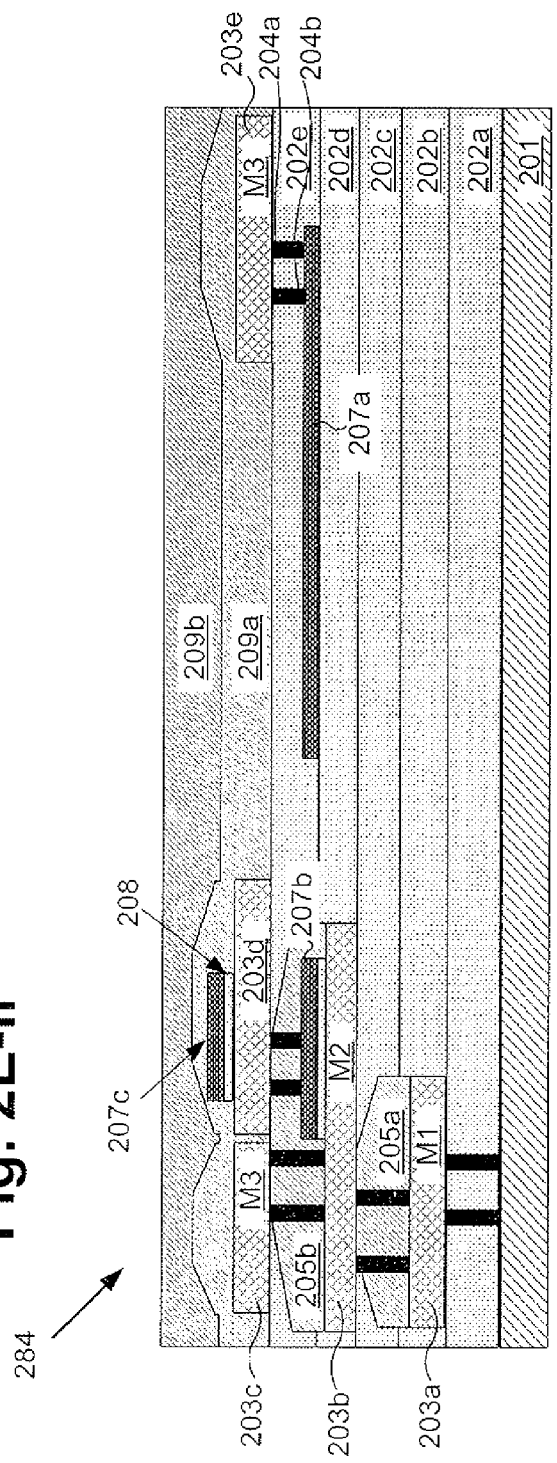
Fig. 2E-i
Fig. 2E-ii

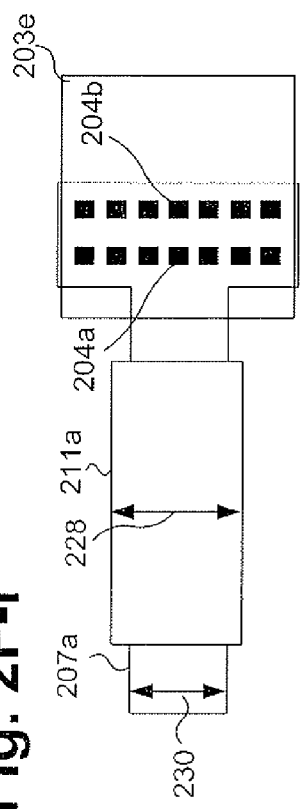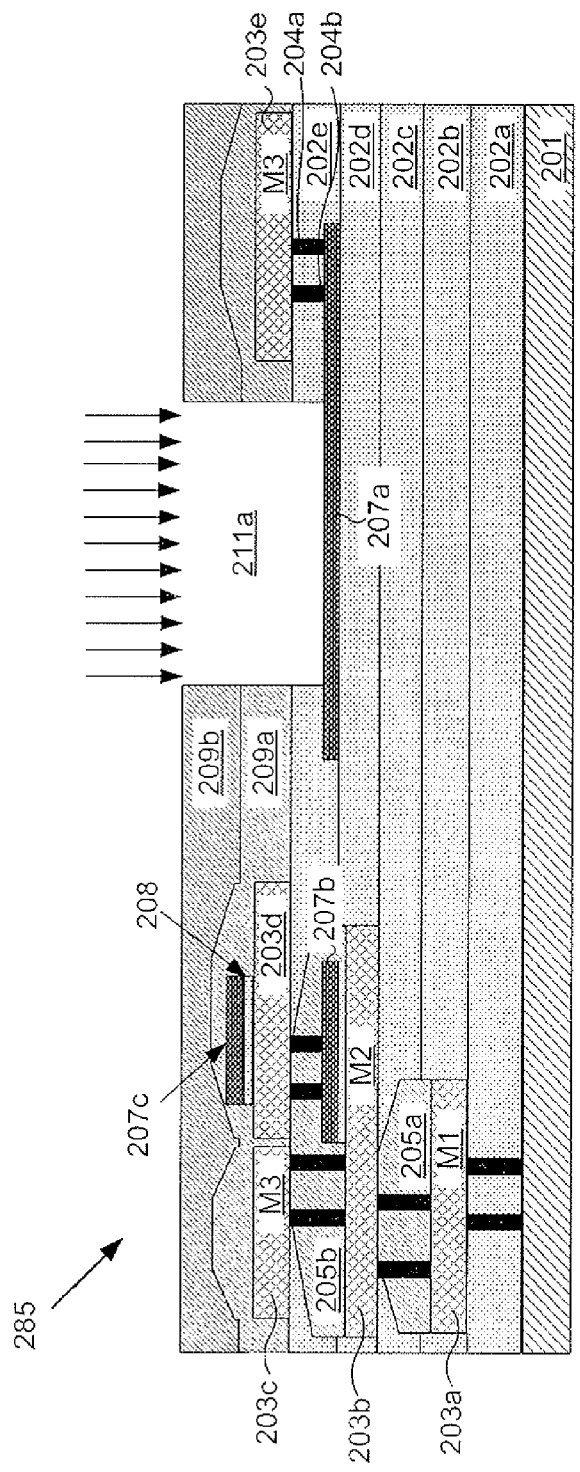

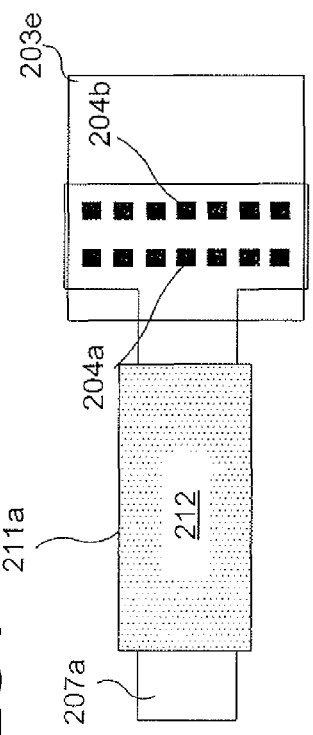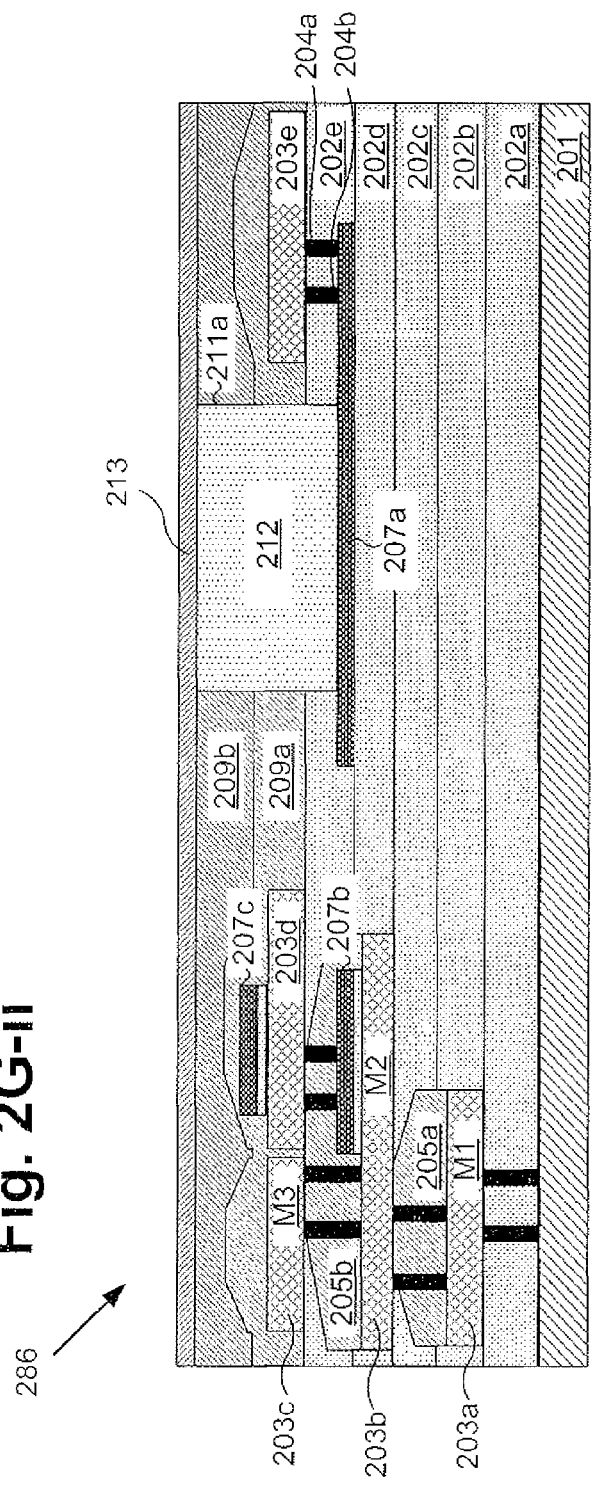
Fig. 2G-i
Fig. 2G-ii

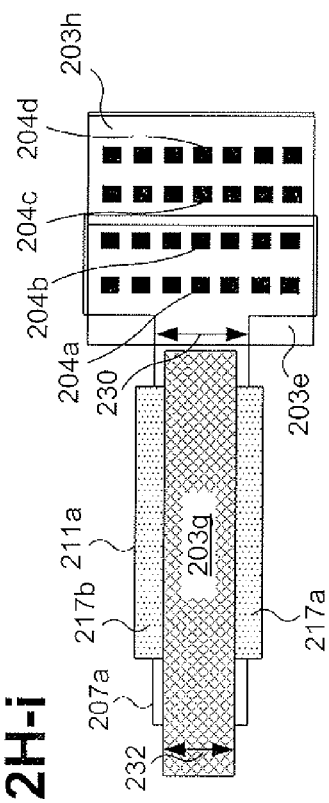
Fig. 2H-i
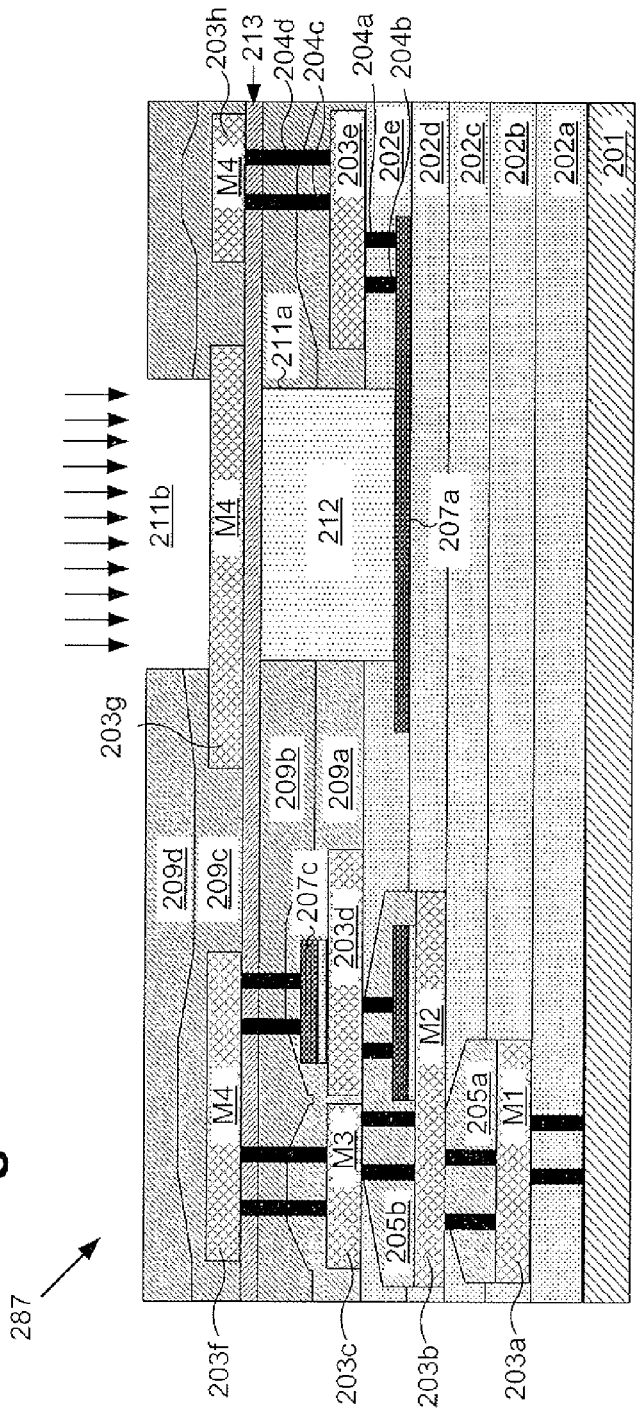
Fig. 2H-ii

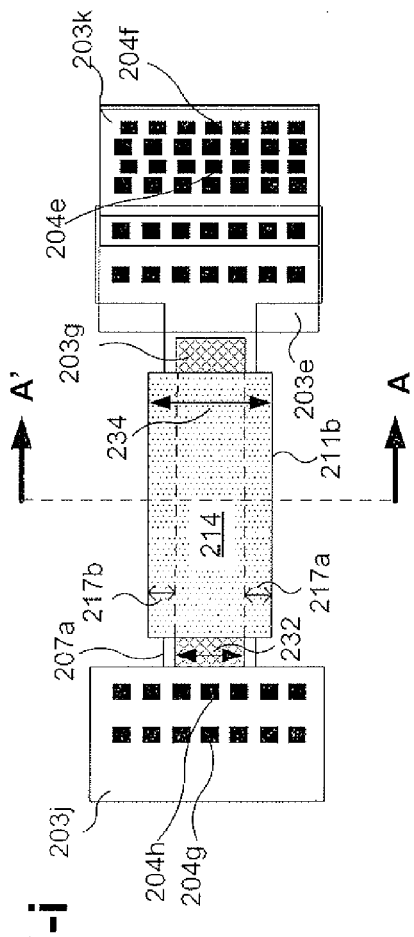
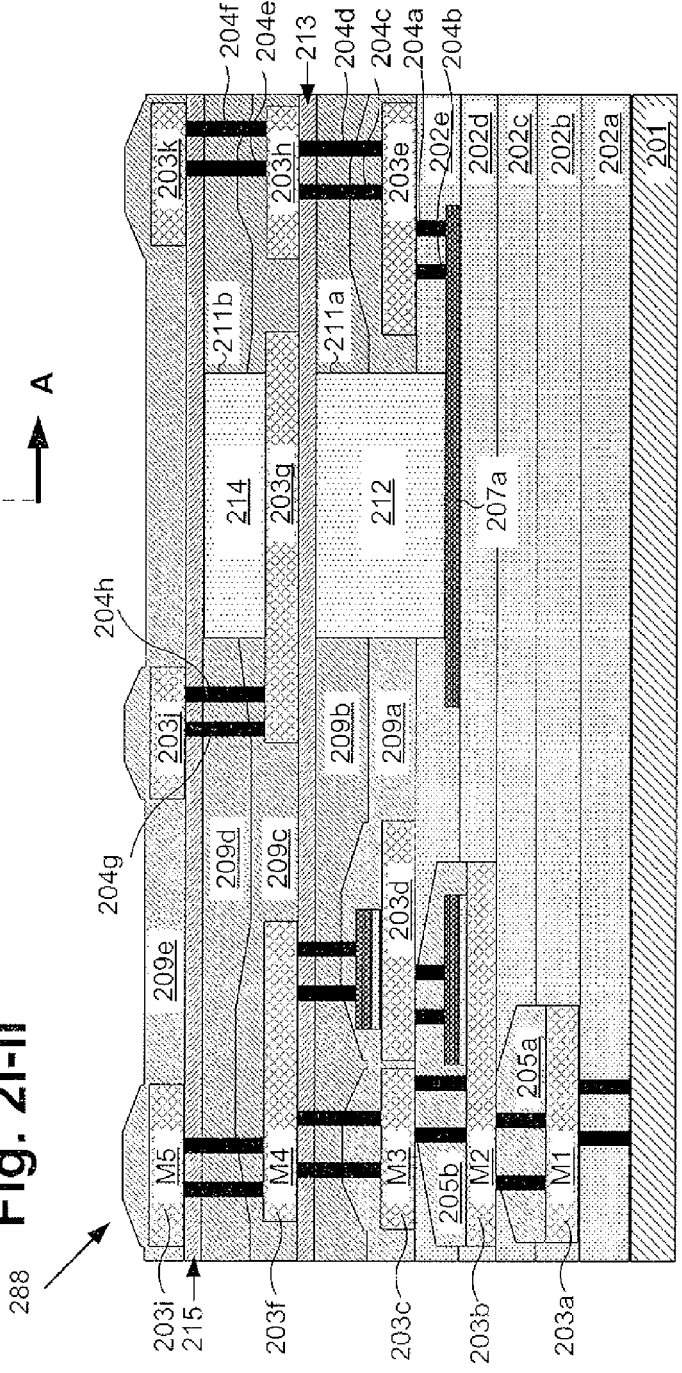
Fig. 2I-i
Fig. 2I-ii

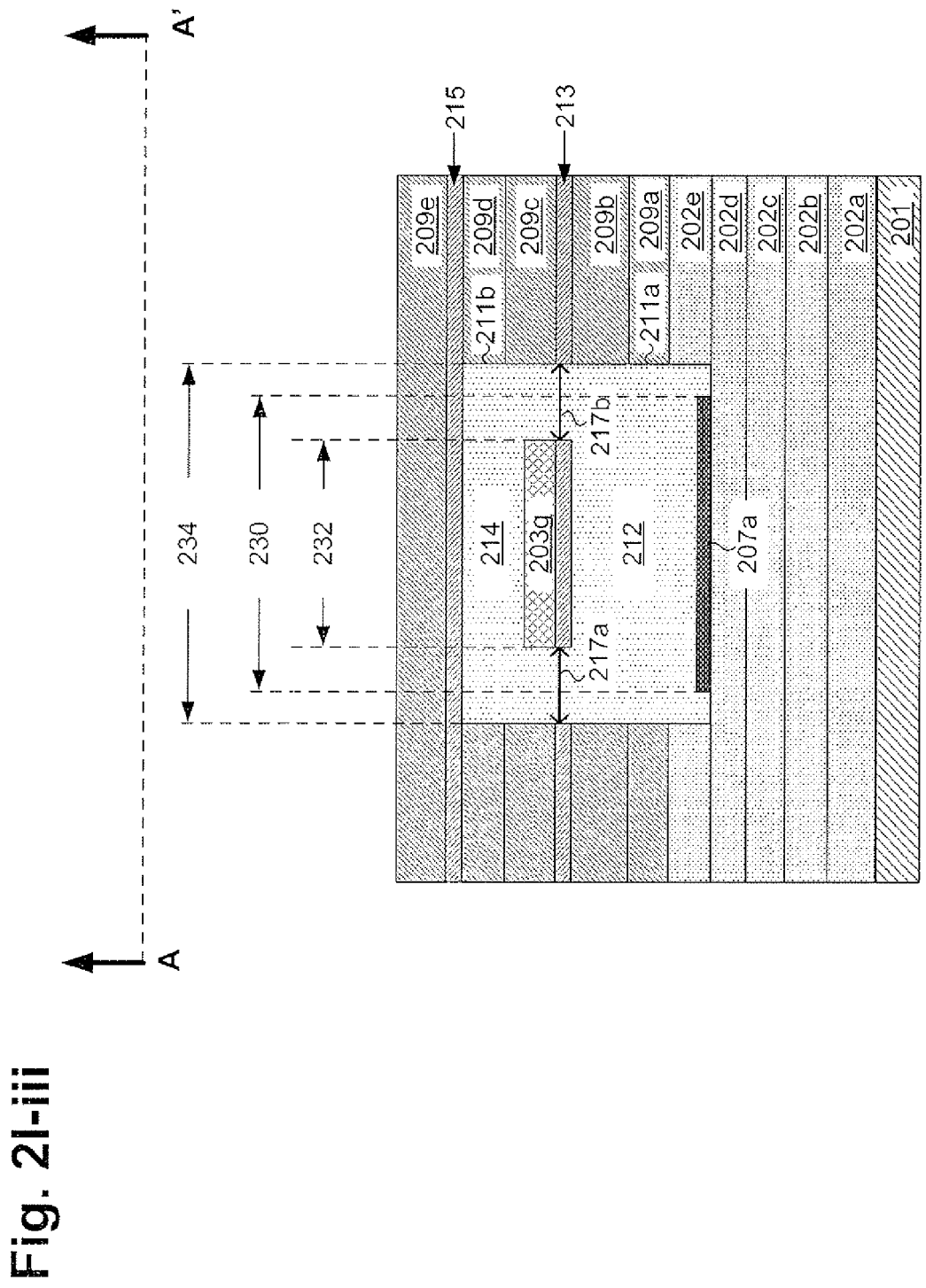
Fig. 2I-iii

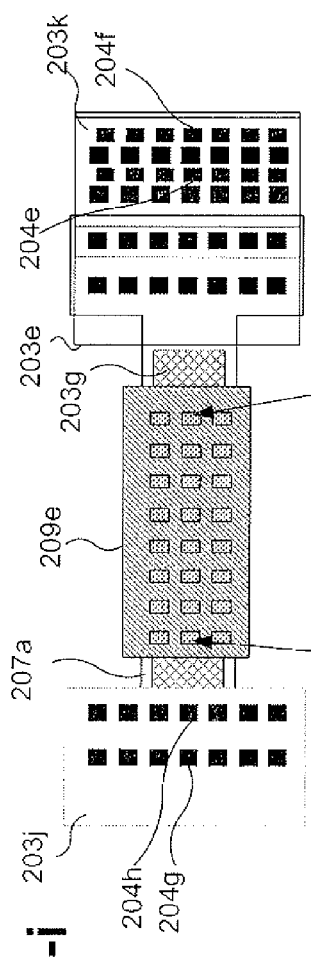
Fig. 2J-i
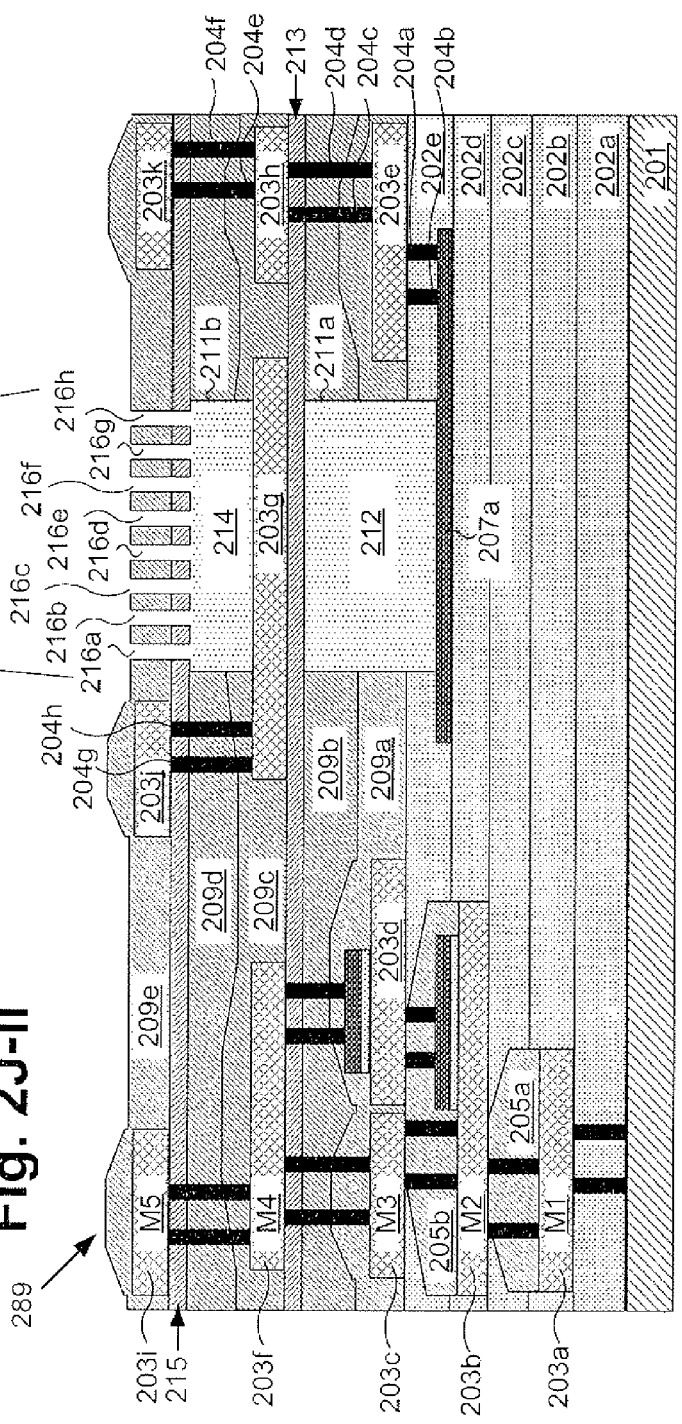
Fig. 2J-ii

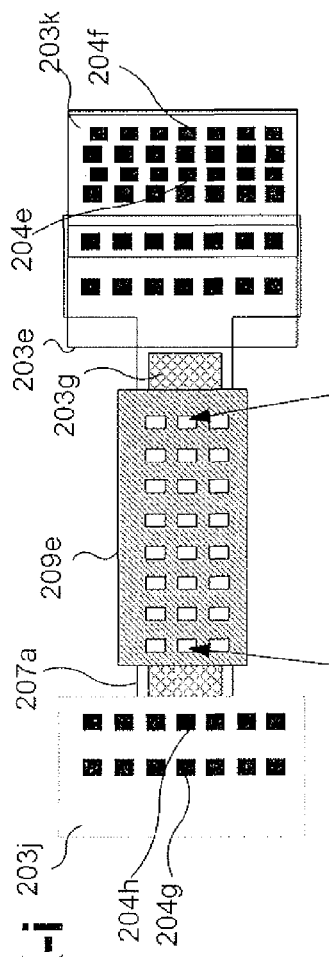
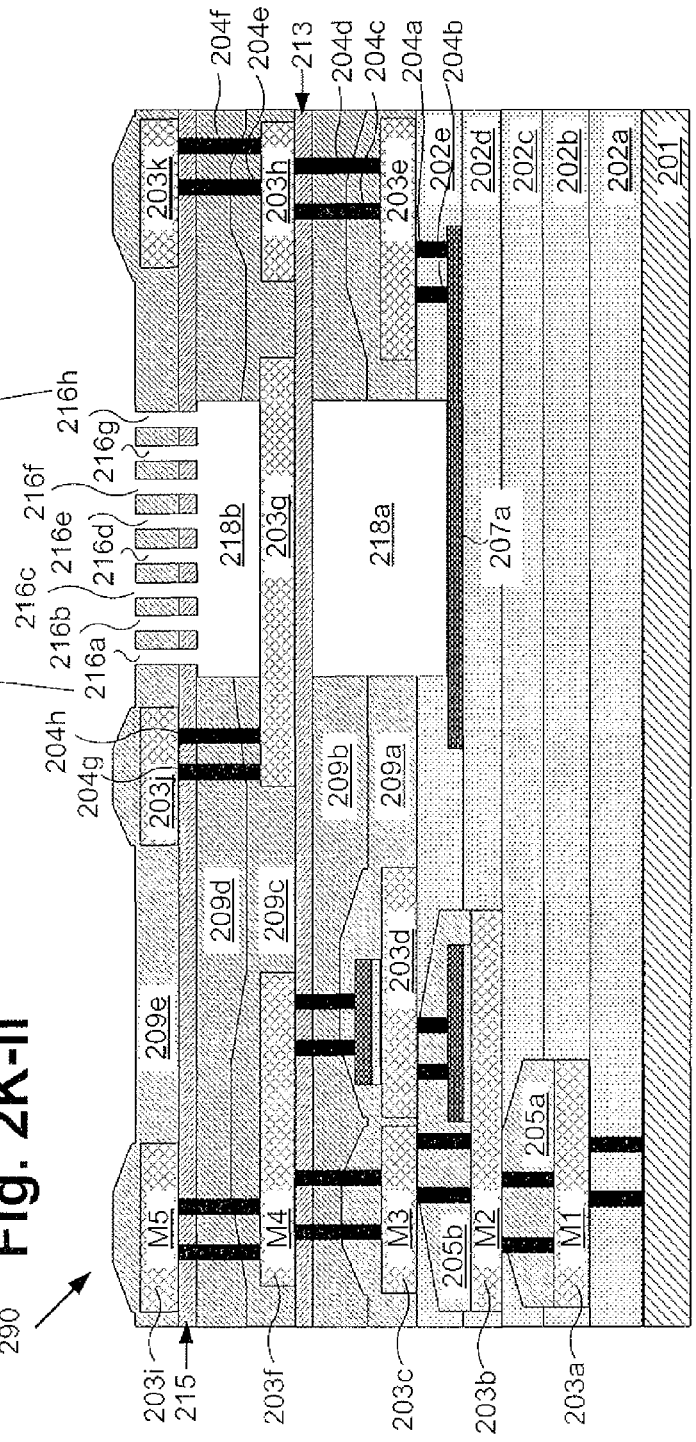
Fig. 2K-i
Fig. 2K-ii

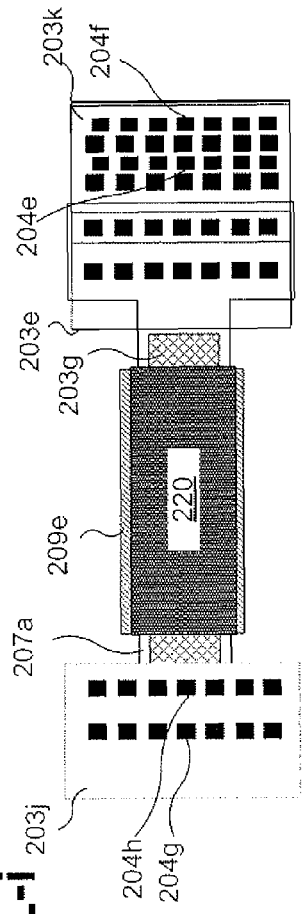
Fig. 2L-i
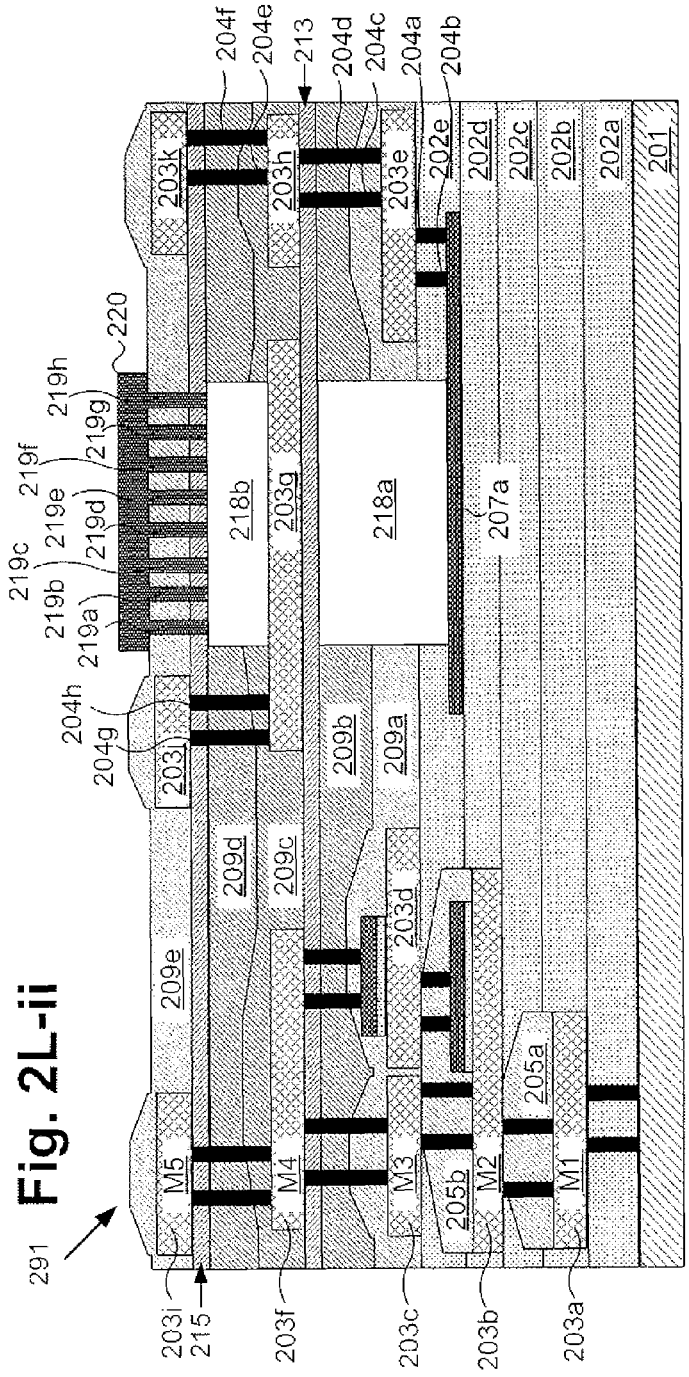
Fig. 2L-ii

MEMS DEVICE WITH SEALED CAVITY AND METHOD FOR FABRICATING SAME The present application claims the benefit of and priority to a provisional patent application titled "Fabrication and Sealing of a MEMS Cavity with a Controlled Environment and Related Structure," Ser. No. 61/914,178, filed on Dec. 10, 2013. The disclosure in this provisional application is hereby incorporated fully by reference into the present application.

BACKGROUND

In Micro Electro Mechanical Systems (MEMS) devices, mechanical and electronic components may be combined to form miniature electronic devices in sealed cavities. Although MEMS devices may take a variety of forms to perform various functions, in general, the cavities which are part of MEMS devices need to be sealed with a particular pressure, such as a sub-atmospheric pressure, to suit the needs of a particular application. Sealing the cavity of a MEMS device at a particular pressure provides the MEMS device with a desired operating pressure, which is designed to be impervious to changes in pressure that may be experienced by unsealed portions of the semiconductor die in which the MEMS device resides.

One commonly utilized technique for forming a sealed MEMS cavity involves placing two wafers in a special tool to form the sealed cavity in a pressurized environment. This technique results in relatively large physical dimensions of the MEMS cavity. Another technique involves dissecting a special lid from a wafer, forming a cavity in the wafer, and re-sealing the wafer with the special lid in a specially designed pressurized tool. This technique increases both production time and expense.

In addition, a drawback of employing traditional techniques of forming sealed cavities, such as those described above, is that in order to form multiple MEMS cavities, these processes need to be repeated for each MEMS cavity on the wafer. Moreover, employing the traditional approaches increases the risk of damage to the MEMS plates inside the MEMS cavity and results in impairment of device performance.

SUMMARY

The present disclosure is directed to a MEMS device with sealed cavity and method for fabricating same, substantially as shown in and/or described in connection with at least one of the figures, and as set forth more completely in the claims.

BRIEF DESCRIPTION OF THE DRAWINGS

FIG. 2A-i illustrates a top view of a portion of a wafer processed in accordance with an initial action in the flowchart of FIG. 1 according to one implementation of the present application.

FIG. 2A-ii illustrates a cross-sectional view of a portion of a wafer processed in accordance with an initial action in the flowchart of FIG. 1 according to one implementation of the present application.

FIG. 2B-i illustrates a top view of a portion of the wafer processed in accordance with an intermediate action in the flowchart of FIG. 1 according to one implementation of the present application.

FIG. 2B-ii illustrates a cross-sectional view of a portion of the wafer processed in accordance with an intermediate action in the flowchart of FIG. 1 according to one implementation of the present application.

FIG. 2C-i illustrates a top view of a portion of the wafer processed in accordance with an intermediate action in the flowchart of FIG. 1 according to one implementation of the present application.

FIG. 2C-ii illustrates a cross-sectional view of a portion of the wafer processed in accordance with an intermediate action in the flowchart of FIG. 1 according to one implementation of the present application.

FIG. 2D-i illustrates a top view of a portion of the wafer processed in accordance with an intermediate action in the flowchart of FIG. 1 according to one implementation of the present application.

FIG. 2D-ii illustrates a cross-sectional view of a portion of the wafer processed in accordance with an intermediate action in the flowchart of FIG. 1 according to one implementation of the present application.

FIG. 2E-i illustrates a top view of a portion of the wafer processed in accordance with an intermediate action in the flowchart of FIG. 1 according to one implementation of the present application.

FIG. 2E-ii illustrates a cross-sectional view of a portion of the wafer processed in accordance with an intermediate action in the flowchart of FIG. 1 according to one implementation of the present application.

FIG. 2F-i illustrates a top view of a portion of the wafer processed in accordance with an intermediate action in the flowchart of FIG. 1 according to one implementation of the present application.

FIG. 2F-ii illustrates a cross-sectional view of a portion of the wafer processed in accordance with an intermediate action in the flowchart of FIG. 1 according to one implementation of the present application.

FIG. 2G-i illustrates a top view of a portion of the wafer processed in accordance with an intermediate action in the flowchart of FIG. 1 according to one implementation of the present application.

FIG. 2G-ii illustrates a cross-sectional view of a portion of the wafer processed in accordance with an intermediate action in the flowchart of FIG. 1 according to one implementation of the present application.

FIG. 2H-i illustrates a top view of a portion of the wafer processed in accordance with an intermediate action in the flowchart of FIG. 1 according to one implementation of the present application.

FIG. 2H-ii illustrates a cross-sectional view of a portion of the wafer processed in accordance with an intermediate action in the flowchart of FIG. 1 according to one implementation of the present application.

FIG. 2I-i illustrates a top view of a portion of the wafer processed in accordance with an intermediate action in the flowchart of FIG. 1 according to one implementation of the present application.

FIG. 2I-ii illustrates a cross-sectional view of a portion of the wafer processed in accordance with an intermediate action in the flowchart of FIG. 1 according to one implementation of the present application.

FIG. 2I-iii illustrates another cross-sectional view of a portion of the wafer processed in accordance with an intermediate action in the flowchart of FIG. 1 according to one implementation of the present application.

FIG. 2J-i illustrates a top view of a portion of the wafer processed in accordance with an intermediate action in the flowchart of FIG. 1 according to one implementation of the present application.

FIG. 2J-ii illustrates a cross-sectional view of a portion of the wafer processed in accordance with an intermediate action in the flowchart of FIG. 1 according to one implementation of the present application.

FIG. 2K-i illustrates a top view of a portion of the wafer processed in accordance with an intermediate action in the flowchart of FIG. 1 according to one implementation of the present application.

FIG. 2K-ii illustrates a cross-sectional view of a portion of the wafer processed in accordance with an intermediate action in the flowchart of FIG. 1 according to one implementation of the present application.

FIG. 2L-i illustrates a top view of a portion of the wafer processed in accordance with an intermediate action in the flowchart of FIG. 1 according to one implementation of the present application.

FIG. 2L-ii illustrates a cross-sectional view of a portion of the wafer processed in accordance with an intermediate action in the flowchart of FIG. 1 according to one implementation of the present application.

DETAILED DESCRIPTION

Figure 1:
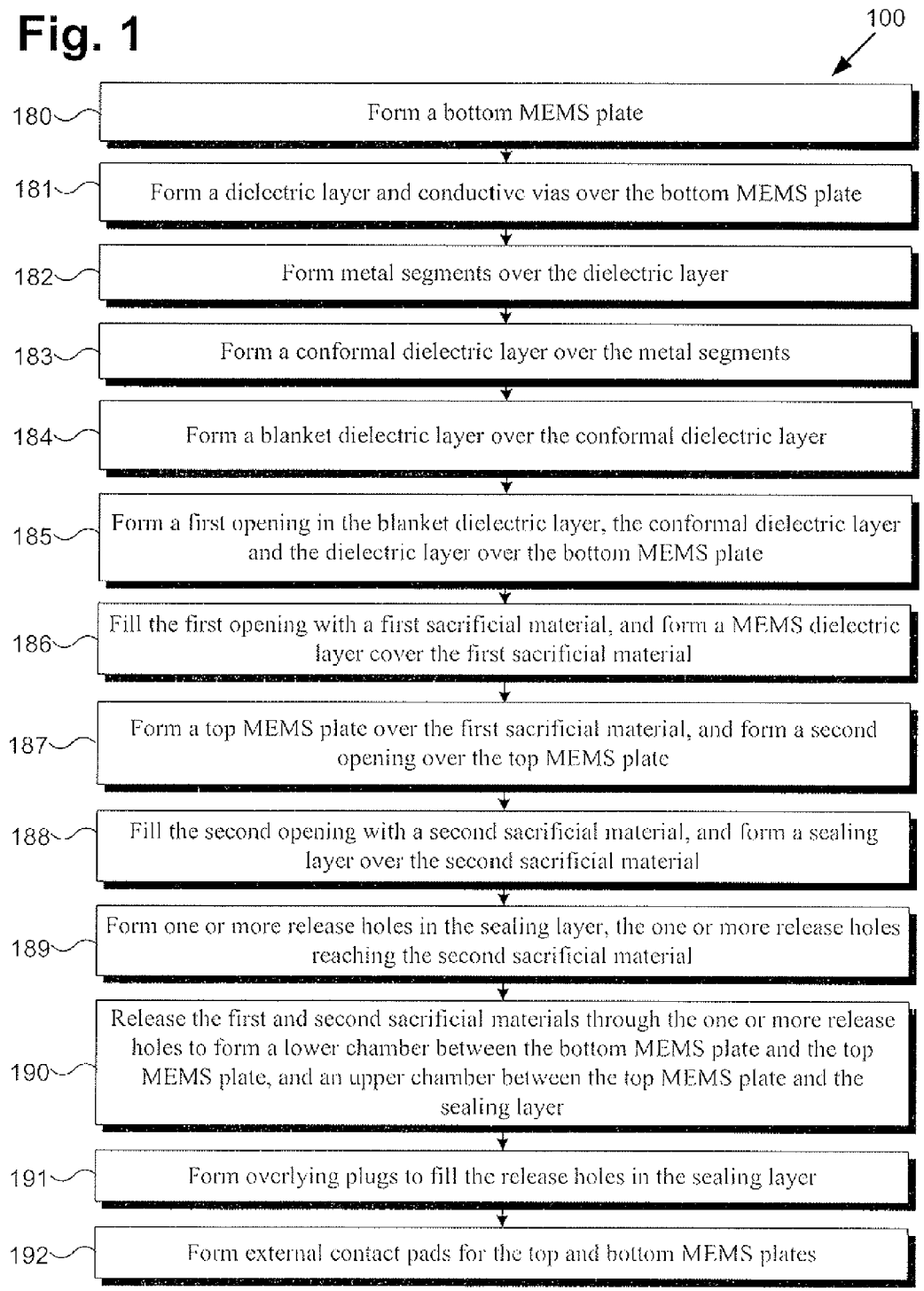
FIG. 1 is a flowchart illustrating a method for fabricating a MEMS device according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 2M:
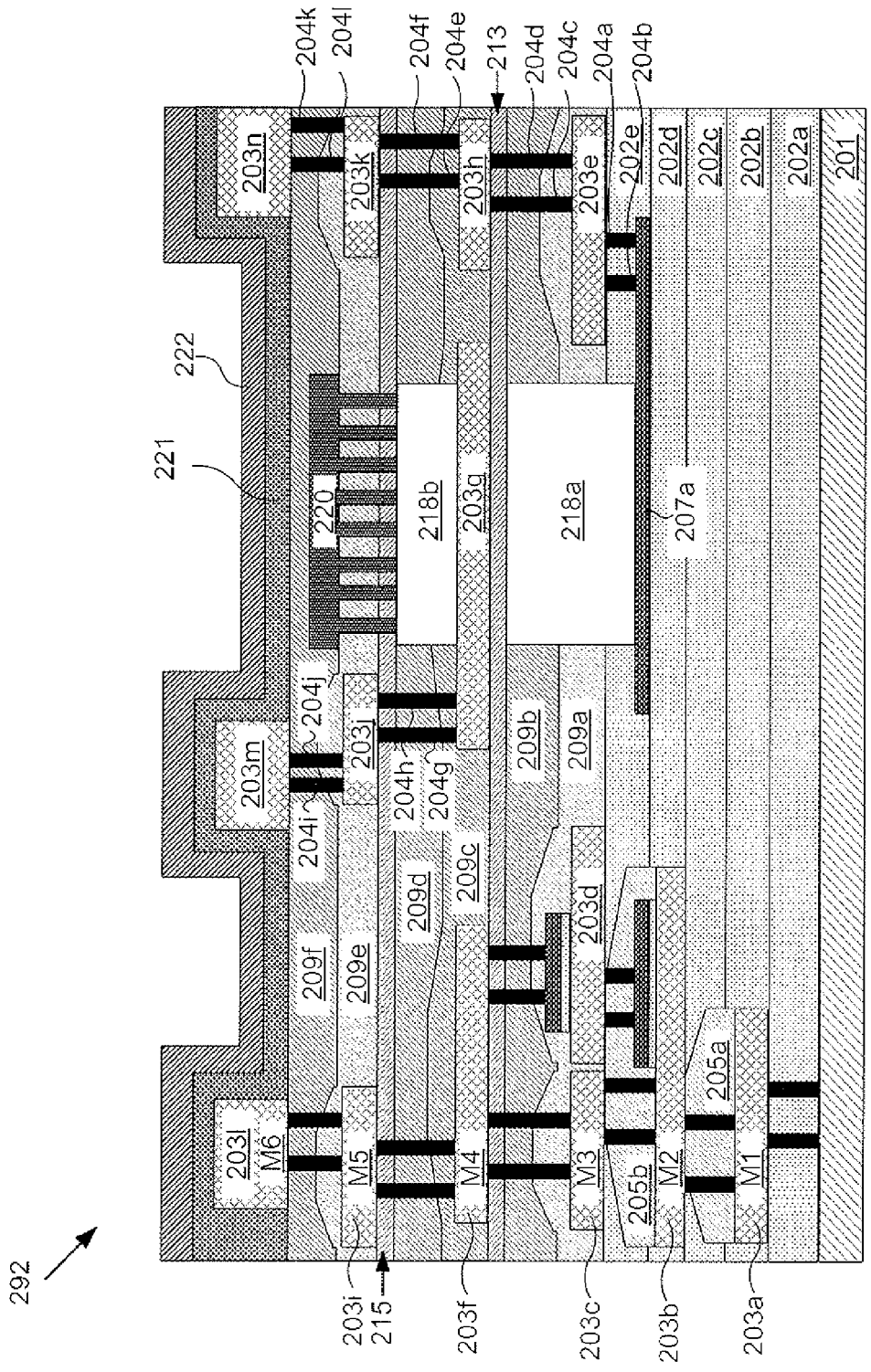
FIG. 2M illustrates a cross-sectional view of a portion of the wafer processed in accordance with a final action in the flowchart of FIG. 1 according to one implementation of the present application.

FIG. 1 shows flowchart 100, which describes the actions, according to one implementation disclosed herein, for fabricating an advantageous MEMS device. Certain details and features have been left out of flowchart 100 that are apparent to a person of ordinary skill in the art. For example, an action may comprise one or more sub actions or may involve specialized equipment or materials, as is known in the art. While actions 180 through 192 indicated in flowchart 100 are sufficient to describe one implementation disclosed herein, other implementations disclosed herein may use actions different from those shown in flowchart 100. FIG. 2A-ii through FIG. 2L-ii, and structures 280 through 291 illustrate the result of performing actions 180 through 191 of flowchart 100 of FIG. 1, respectively. For example, structure 280 shows a semiconductor wafer after action 180, structure 281 shows structure 280 after action 181, structure 282 shows structure 281 after action 182, and so forth. Structure 292 in FIG. 2M illustrates a cross-sectional view of a portion of a wafer processed in accordance with final action 192 in flowchart 100 of FIG. 1 according to one implementation of the present application.

As shown in flowchart 100, action 180 includes forming a bottom MEMS plate. The result of action 180 is illustrated by reference to FIGS. 2A-i and 2A-ii. FIG. 2A-i illustrates a top view of bottom MEMS plate 207a after completion of action 180 in flowchart 100 of FIG. 1, according to one implementation of the present disclosure. FIG. 2A-ii illustrates exemplary cross-sectional view of structure 280 after completion of action 180 in flowchart 100 of FIG. 1.

As shown in FIG. 2A-ii, structure 280 includes semiconductor substrate 201, dielectric layers 202a, 202b, 202c and 202d, metal segment 203a formed in metal layer M1, metal segment 203b formed in metal layer M2, dielectric material 205a and 205b, dielectric layer 206 and bottom MEMS plate 207a. As illustrated in FIG. 2A-ii, bottom MEMS plate 207a is formed over a top surface of dielectric layer 202d. Bottom MEMS plate 207a may be a thin resistor layer, a bottom plate of a capacitor, and/or a layer of a passive device. In one implementation, bottom MEMS plate 207a conductive layer 207b may be formed of the same material.

In the present implementation, semiconductor substrate 201 may include, for example, silicon. However, semiconductor substrate 201 is not limited to silicon and may be any appropriate substrate material. In one implementation, semiconductor substrate 201 may be a high resistivity substrate. Dielectric layers 202a, 202b, 202c and 202d may each include oxides (e.g., silicon oxide), nitrides (e.g., silicon nitride), or any other suitable dielectric material. Metal segment 203a may be formed by depositing metal layer M1 over a top surface of dielectric layer 202a and patterning metal layer M1. Metal segment 203b may be formed by depositing metal layer M2 over a top surface of dielectric layer 202c and patterning metal layer M2. In one implementation, metal segment 203b may form a bottom plate of a first metal-insulator-metal (MIM) capacitor. Conductive layer 207b, which may form a top metal plate for the first MIM capacitor, is disposed over metal segment 203b and separated from metal segment 203b by dielectric layer 206. Thus, metal segment 203b, dielectric layer 206 and conductive layer 207b may form the first MIM capacitor in structure 280. Dielectric material 205a may be formed over metal segment 203a. Dielectric material 205b may be formed over metal segment 203b, and cover dielectric layer 206 and conductive layer 207b.

Metal segment 203a is electrically coupled to metal segment 203b by conductive vias as shown in FIG. 2A-ii. The conductive vias may be formed by etching vias through dielectric layer 202c and dielectric material 205a, depositing conductive material in the vias, and planarizing the conductive material with a top surface of dielectric layer 202c. The conductive vias may include, for example, tungsten, copper, aluminum, or any other suitable conductive material.

Referring to flowchart 100 of FIG. 1, action 181 includes forming a dielectric layer and conductive vias over the bottom MEMS plate. The result of action 181 is illustrated by reference to FIGS. 2B-i and 2B-ii. FIG. 2B-i illustrates a top view of bottom MEMS plate 207a after completion of action 181 in flowchart 100 of FIG. 1, according to one implementation of the present disclosure. FIG. 2B-ii illustrates exemplary cross-sectional view of structure 281 after completion of action 181 in flowchart 100 of FIG. 1.

As shown in FIG. 2B-i, dielectric layer 202e (shown in exemplary cross-sectional view of structure 281 in FIG. 2B-ii) and a plurality of conductive vias, such as conductive vias 204a and 204b, are formed over bottom MEMS plate 207a. As shown in FIG. 2B-ii, structure 281 includes dielectric layer 202e and conductive vias 204a and 204b formed over bottom MEMS plate 207a. Dielectric layer 202e may include oxides, nitrides, or any other suitable dielectric material. Conductive vias 204a and 204b extend through dielectric layer 202e to reach bottom MEMS plate 207a.

As shown in FIG. 2B-ii, electrical connections to metal segment 203b and conductive layer 207b are also formed using conductive vias, which may be formed concurrently with conductive vias 204a and 204b. The conductive vias, including conductive vias 204a and 204b, are planarized to have a coplanar top surface with dielectric layer 202e.

Referring to flowchart 100 of FIG. 1, action 182 includes forming metal segments over the dielectric layer. The result of action 182 is illustrated by reference to FIGS. 2C-i and 2C-ii. FIG. 2C-i illustrates a top view of bottom MEMS plate 207a, conductive vias 204a and 204b, and metal segment 203e after completion of action 182 in flowchart 100 of FIG. 1, according to one implementation of the present disclosure. FIG. 2C-ii illustrates exemplary cross-sectional view of structure 282 after completion of action 182 in flowchart 100 of FIG. 1.

As shown in FIG. 2C-ii, structure 282 includes metal segments 203c, 203d and 203e, conductive layer 207c and dielectric layer 208. Metal segment 203b and conductive layer 207b are electrically connect to metal segment 203c and metal segment 203d, respectively, through conductive vias. Metal segment 203d may form a bottom plate of a second MIM capacitor. Conductive layer 207c, which may form a top metal plate for the second MIM capacitor, is disposed over metal segment 203d and separated from metal segment 203d by dielectric layer 208. Thus, metal segment 203d, dielectric layer 208 and conductive layer 207c form the second MIM capacitor. As also shown in FIG. 2C-ii, metal segment 203e is formed over dielectric layer 202e and electrically connected to bottom MEMS plate 207a through conductive vias 204a and 204b.

Referring to flowchart 100 of FIG. 1, action 183 includes forming a conformal dielectric layer over the metal segments. The result of action 183 is illustrated by reference to FIGS. 2D-i and 2D-ii. FIG. 2D-i illustrates a top view of bottom MEMS plate 207a, conductive vias 204a and 204b, and metal segment 203e after completion of action 183 in flowchart 100 of FIG. 1, according to one implementation of the present disclosure. FIG. 2D-ii illustrates exemplary cross-sectional view of structure 283 after completion of action 183 in flowchart 100 of FIG. 1.

As shown in FIG. 2D-i, conformal dielectric layer 209a (shown in exemplary cross-sectional view of structure 283 in FIG. 2D-ii) is formed over metal segment 203e. As illustrated in FIG. 2D-ii, structure 283 includes conformal dielectric layer 209a over metal segments 203c, 203d and 203e, conductive layer 207c, dielectric layer 208, and portions of a top surface of dielectric layer 202e. Conformal dielectric layer 209a may be formed of any suitable dielectric material, such as oxides and nitrides.

Referring to flowchart 100 of FIG. 1, action 184 includes forming a blanket dielectric layer over the conformal dielectric layer. The result of action 184 is illustrated by reference to FIGS. 2E-i and 2E-ii. FIG. 2E-i illustrates a top view of bottom MEMS plate 207a, conductive vias 204a and 204b, and metal segment 203e after completion of action 184 in flowchart 100 of FIG. 1, according to one implementation of the present disclosure. FIG. 2E-ii illustrates exemplary cross-sectional view of structure 284 after completion of action 184 in flowchart 100 of FIG. 1.

As shown in FIG. 2E-i, blanket dielectric layer 209b is formed over conformal dielectric layer 209a (shown in exemplary cross-sectional view of structure 284 in FIG. 2E-ii). As illustrated in FIG. 2E-ii, structure 284 includes blanket dielectric layer 209b over conformal dielectric layer 209a. In one implementation, blanket dielectric layer 209b may be formed over conformal dielectric layer 209a and planarized using chemical mechanical polishing (CMP), for example. Blanket dielectric layer 209b may be formed of any suitable dielectric material, such as oxides and nitrides. In one implementation, blanket dielectric layer 209b may be formed of the same material as conformal dielectric layer 209a. In another implementation, conformal dielectric layer 209a and blanket dielectric layer 209b may be formed of different materials.

Referring to flowchart 100 of FIG. 1, action 185 includes forming a first opening in the blanket dielectric layer, the conformal dielectric layer and the dielectric layer over the bottom MEMS plate. The result of action 185 is illustrated by reference to FIGS. 2F-i and 2F-ii. FIG. 2F-i illustrates a top view of opening 211a, bottom MEMS plate 207a, conductive vias 204a and 204b, and metal segment 203e after completion of action 185 in flowchart 100 of FIG. 1, according to one implementation of the present disclosure. FIG. 2F-ii illustrates exemplary cross-sectional view of structure 285 after completion of action 185 in flowchart 100 of FIG. 1.

As shown in FIG. 2F-i, opening 211a is formed over bottom MEMS plate 207a. In the present implementation, width 228 of opening 211a is greater than width 230 of bottom MEMS plate 207a. In other implementations, width 228 of opening 211a may be less than or equal to width 230 of bottom MEMS plate 207a.

As shown in FIG. 2F-ii, structure 285 includes opening 211a extending through blanket dielectric layer 209b, conformal dielectric layer 209a and dielectric layer dielectric layer 202e, and exposing a top surface of bottom MEMS plate 207a. Various etching techniques may be employed to create opening 211a. In one implementation, opening 211a may be created by wet etching, such as isotropic etching and hydrofluoric etching. In another implementation, opening 211a may be created by dry etching, such as vapor etching and plasma etching.

Referring to flowchart 100 of FIG. 1, action 186 includes filling the first opening with a first sacrificial material and forming a MEMS dielectric layer over the first sacrificial material. The result of action 186 is illustrated by reference to FIGS. 2G-i and 2G-ii. FIG. 2G-i illustrates a top view of sacrificial material 212 in opening 211a, bottom MEMS plate 207a, conductive vias 204a and 204b, and metal segment 203e after completion of action 186 in flowchart 100 of FIG. 1, according to one implementation of the present disclosure. FIG. 2G-ii illustrates exemplary cross-sectional view of structure 286 after completion of action 186 in flowchart 100 of FIG. 1.

As shown in FIG. 2G-ii, structure 286 includes sacrificial material 212 deposited in opening 211a, and MEMS dielectric layer 213 over sacrificial material 212 and blanket dielectric layer 209b. Sacrificial material 212 may include polymeric material, Group IV semiconductor materials (e.g., silicon-based material, amorphous silicon, germanium, amorphous germanium, and silicon-germanium), and dielectric materials (e.g., oxide and nitride materials). In case sacrificial material 212 is formed of a dielectric material, sacrificial material 212 should be formed of a dielectric material different than the materials used for blanket dielectric layer 209b, conformal dielectric layer 209a and dielectric layer 202e, so that the removal of sacrificial material 212 is selective and does not cause damage to the dielectric layers surrounding opening 211a. For example, if an oxide-based material (e.g., silicon oxide) is used to form blanket dielectric layer 209b, conformal dielectric layer 209a and dielectric layer 202e, then a non-oxide based material, such as a nitride-based material (e.g., silicon nitride) may be used as sacrificial material 212 in opening 211a.

After depositing sacrificial material 212, an upper surface of sacrificial material 212 is planarized such that sacrificial material 212 and portions of blanket dielectric layer 209b have a coplanar top surface. MEMS dielectric layer 213 is then formed on the coplanar surface of sacrificial material 212 and blanket dielectric layer 209b. In one implementation, MEMS dielectric layer 213 may be omitted from the MEMS device.

Referring to flowchart 100 of FIG. 1, action 187 includes forming a top MEMS plate over the first sacrificial material, and forming a second opening over the top MEMS plate. The result of action 187 is illustrated by reference to FIGS. 2H-i and 2H-ii. FIG. 2H-i illustrates a top view of top MEMS plate 203g over sacrificial material 212 after completion of action 187 in flowchart 100 of FIG. 1, according to one implementation of the present disclosure. FIG. 2H-ii illustrates exemplary cross-sectional view of structure 287 after completion of action 187 in flowchart 100 of FIG. 1.

As shown in FIG. 2H-i, top MEMS plate 203g is formed over sacrificial material 212. In the present implementation, MEMS plate 203g includes at least one segment that is narrower than bottom MEMS plate 207a. For example, as illustrated in FIG. 2H-i, width 232 of top MEMS plate 203g is narrower than width 230 of bottom MEMS plate 207a. Because top MEMS plate 203g is narrower than bottom MEMS plate 207a and opening 211a, sacrificial material 212 in opening 211a is exposed in regions 217a and 217b beyond width 232 of top MEMS plate 203g. Thus, regions 217a and 217b allow sacrificial material 212 to be in contact with another sacrificial material formed in opening 211b (shown in exemplary cross-sectional view of structure 288 in FIG. 2I-ii).

As shown in FIG. 2H-ii, structure 287 includes conductive vias 204c and 204d, and metal segments 203f and 203h, top MEMS plate 203g, conformal dielectric layer 209c, blanket dielectric layer 209d and opening 211b. Metal segments 203h is electrically connected to metal segment 203e through conductive vias 204c and 204d. Also, metal segment 203c and conductive layer 207c are electrically connected to metal segment 203f through conductive vias. In one implementation, metal segments 203f and 203h in metal layer M4 may be part of a standard circuitry, while top MEMS plate 203g in metal layer M4 may be a top MEMS plate for a MEMS device, such as an actuator element or a vibrating element of a resonator.

Conformal dielectric layer 209c is formed over and covers metal segments 203f and 203h, top MEMS plate 203g, and portions of a top surface of MEMS dielectric layer 213. Blanket dielectric layer 209d may be formed over conformal dielectric layer 209c and planarized using chemical mechanical polishing (CMP), for example. Conformal dielectric layer 209c and blanket dielectric layer 209d may be formed of any suitable dielectric material, such as oxides and nitrides. In one implementation, blanket dielectric layer 209d may be formed of the same material as conformal dielectric layer 209c. In another implementation, conformal dielectric layer 209e and blanket dielectric layer 209d may be formed of different materials.

As further shown in FIG. 2H-ii, opening 211b may be formed in structure 287, for example, by an etching process substantially similar to the etching process used to form opening 211a discussed above. Opening 211b may expose a top surface of top MEMS plate 203g, and may have a width substantially the same as width 228 of opening 211a. In one implementation, openings 211a and 211b may be partially separated by top MEMS plate 203g, and in communication with each other in regions 217a and 217b beyond width 232 of top MEMS plate 203g.

Referring to flowchart 100 of FIG. 1, action 188 includes filling the second opening with a second sacrificial material, and forming a sealing layer over the second sacrificial material. The result of action 188 is illustrated by reference to FIGS. 2I-i, 2I-ii, and 2I-iii. FIG. 2I-i illustrates a top view of sacrificial material 214 in opening 211b after completion of action 186 in flowchart 100 of FIG. 1, according to one implementation of the present disclosure. FIG. 2I-ii illustrates exemplary cross-sectional view of structure 288 after completion of action 188 in flowchart 100 of FIG. 1. FIG. 2I-iii illustrates exemplary cross-sectional view of structure 288 along line A-A' in FIG. 2I-i after completion of action 188 in flowchart 100 of FIG. 1.

As shown in FIG. 2I-i, sacrificial material 214 is deposited in opening 211b. In the present implementation, width 234 of opening 211b is substantially the same as width 228 of opening 211a (shown in FIG. 2F-ii). Thus, width 234 of opening 211b is greater than width 232 of top MEMS plate 203g. In other implementations, width 234 of opening 211b may be smaller or greater than width 228 of opening 211a.

As shown in FIG. 2I-ii, structure 288 includes sacrificial material 214, conductive vias 204e, 204f, 204g and 204h, barrier dielectric layer 215, metal segments 203i, 203j and 203k, and sealing layer 209e. Opening 211b is filled with sacrificial material 214. Since openings 211a and 211b are connected to each other at regions 217a and 217b, for example, sacrificial material 214 is in direct contact with sacrificial material 212 in opening 211a. In one implementation, sacrificial materials 212 and 214 may be formed of the same material, for example, amorphous silicon. However, sacrificial materials 212 and 214 may be formed of different materials. For example, sacrificial material 212 may include group-II semiconductor materials, and sacrificial material 214 may include group-I and/or group-III semiconductor materials. For example, sacrificial material 212 may be amorphous silicon. Sacrificial material 214 may be polymeric material (e.g., polyimide) or dielectric material. In case where sacrificial materials 212 and 214 are made of different materials, a different release agent may be used to release each sacrificial material. Sacrificial material 214 is then planarized such that a top surface of sacrificial material 214 is coplanar with a top surface of blanket dielectric layer 209d.

As further shown in FIG. 2I-ii, barrier dielectric layer 215 is optionally formed over the coplanar surface of sacrificial material 214 and blanket dielectric layer 209d. Barrier dielectric layer 215 may be an oxide or nitride layer. In one implementation, barrier dielectric layer 215 may act as an etch-stop layer to protect sacrificial material 214 in opening 211b, when metal layer M5 is formed and patterned to form metal segments 203i, 203j and 203k. As such, the etching of metal layer M5 stops on barrier dielectric layer 215 without penetrating through sacrificial material 214. For example, if amorphous silicon is used as sacrificial material 214 in opening 211b, the metal etch of metal layer M5 would have attacked the silicon if a dielectric layer were not used as an etch-stop layer. However, with barrier dielectric layer 215 between metal layer M5 and sacrificial material 214, sacrificial material 214, such as amorphous silicon, can be protected during the formation of metal segments 203*i*, 203*j* and 203*k*. In another example, if a polymer is used as sacrificial material 214 in opening 211*b*, barrier dielectric layer 215 would provide a barrier or an isolation layer between metal layer M5 and sacrificial material 214 during the deposition and patterning of metal layer M5.

After barrier dielectric layer 215 is deposited, conductive vias, such as conductive vias 204*e*, 204*f*, 204*g* and 204*h*, and metal segments 203*i*, 203*j* and 203*k* are formed. Conductive vias 204*e* and 204*f* electrically connect metal segment 203*h* and metal segment 203*k*. Conductive vias 204*g* and 204*h* electrically connect top MEMS plate 203*g* and metal segment 203*j*. Also, metal segment 203*f* and metal segment 203*i* are also connected through conductive vias. Thereafter, sealing layer 209*e* is formed over metal segments 203*i*, 203*j* and 203*k*, and a top surface of barrier dielectric layer 215 over sacrificial material 214. Sealing layer 209*e* may be formed of any suitable dielectric material. In one implementation, sealing layer 209*e* may be a silicon oxide layer, and barrier dielectric layer 215 may be a silicon nitride layer. However, sealing layer 209*e* and barrier dielectric layer 215 need not be formed of different materials.

As shown in FIG. 2I-iii, width 234 of opening 211*b* is greater than width 232 of top MEMS plate 203*g*. Also, width 232 of top MEMS plate 203*g* is narrower than width 230 of bottom MEMS plate 207*a*. Because top MEMS plate 203*g* is narrower than bottom MEMS plate 207*a* and openings 211*a* and 211*b*, sacrificial material 212 in opening 211*a* and sacrificial material 214 in opening 211*b* are in contact to each other in regions 217*a* and 217*b*. As such, sacrificial material 212 and sacrificial material 214 can be subsequently released in a single processing action.

Referring to flowchart 100 of FIG. 1, action 189 includes forming one or more release holes in the sealing layer, the one or more release holes reaching the second sacrificial material. The result of action 189 is illustrated by reference to FIGS. 2J-i and 2J-ii. FIG. 2J-i illustrates a top view of release holes 216*a* through 216*h* extending through sealing layer 209*e* and barrier dielectric layer 215, and reaching sacrificial material 214. FIG. 2J-ii illustrates exemplary cross-sectional view of structure 287 after completion of action 189 in flowchart 100 of FIG. 1.

As shown in FIG. 2J-ii, structure 289 includes release holes 216*a* through 216*h* formed in sealing layer 209*e* and barrier dielectric layer 215. Release holes 216*a* through 216*h* may be formed by etching through sealing layer 209*e* and barrier dielectric layer 215. It is important that release holes 216*a* through 216*h* make contact with sacrificial material 214 in opening 211*b*, so that release holes 216*a* through 216*h* can be used to release sacrificial materials 212 and 214 during a subsequent release action as discussed below.

Referring to flowchart 100 of FIG. 1, action 190 includes releasing the first and second sacrificial materials through the one or more release holes to form a lower chamber between the bottom MEMS plate and the top MEMS plate, and an upper chamber between the top MEMS plate and the sealing layer. The result of action 190 is illustrated by reference to FIGS. 2K-i and 2K-ii. FIG. 2K-i illustrates a top view of sealing layer 209*e* after sacrificial material 212 sacrificial material 214 have been released through release holes 216*a* through 216*h*. FIG. 2K-ii illustrates exemplary cross-sectional view of structure 289 after completion of action 190 in flowchart 100 of FIG. 1.

As shown in FIG. 2K-ii, structure 290 includes lower chamber 218*a* between bottom MEMS plate 207*a* and top MEMS plate 203*g*, and upper chamber 218*b* between top MEMS plate 203*g* and sealing layer 209*e* after sacrificial material 212 sacrificial material 214 have been released through release holes 216*a* through 216*h*. Because sacrificial materials 212 and 214 are directly connected at regions 217*a* and 217*b*, as shown in FIGS. 2I-i and 2I-iii, sacrificial materials 212 and 214 can be released through a single release process through release holes 216*a* through 216*h*.

In one implementation, regions 217*a* and 217*b* may have sufficient extension beyond width 232 of top MEMS plate 203*g* to allow for a clean removal. In other implementations, the connection between sacrificial materials 212 and 214 can be made at various locations within and/or beyond the interior of top MEMS plate 203*g*. The particular location may depend on the geometry, length, and scale of various MEMS devices. For example, sacrificial materials 212 and 214 may be connected by one or more through-holes in the center of top MEMS plate 203*g*, as discussed in FIG. 4 below.

The removal of sacrificial materials 212 and 214 can be carried out by various removal techniques, preferably in a gas or vapor form. It can also be carried out in a liquid form. To remove sacrificial materials 212 and 214, a removal agent may be applied through release holes 216*a* through 216*h*, the removal agent may then etch away sacrificial materials 212 and 214 by either wet or dry isotropic etching, in which isotropic plasma or vapor may be used to etch away the sacrificial materials. For example, if sacrificial materials 212 and/or 214 include an organic polymer, such as polyimide, then an isotropic oxygen plasma etch may be used to remove the polymeric sacrificial materials. If sacrificial materials 212 and/or 214 include an inorganic oxide, such as silicon dioxide ($SiO_2$), then a fluoride based etchant, such as a hydrofluoric acid vapor ("HF") etchant can be used to attack and remove the oxide sacrificial materials. If sacrificial materials 212 and/or 214 include a silicon-based material, such as amorphous silicon, then a fluorine-based material, such as $NF_3$, can be used to attack and remove the silicon-based sacrificial materials.

The removal of sacrificial materials 212 and 214 must be selective to preserve top MEMS plate 203*g*. If top MEMS plate 203*g* constitutes a moving part of a MEMS device, for example, then a dry etch process would be advantageous so as to avoid potential sources of residue from a wet etch that can cause problems, such as causing "stiction" (i.e., static friction) of the moving part of the MEMS device. Thereafter, the byproduct or reactant of the removal agent and materials 212 and 214 may turn into gas, vapor or liquid, which may be released through release holes 216*a* through 216*h*. In one implementation, the gas, vapor or liquid may be sucked out or pumped out of structure 290 through an exhaust of a processing tool. During the removal process, the processing tool itself may be set at a slightly sub-atmosphere pressure, or have pumping.

After the removal of sacrificial materials 212 and 214, in one implementation, structure 290 may be taken out of the processing tool. As such, an atmosphere pressure of lower chamber 218*a* and upper chamber 218*b* would be the same as their ambient environmental conductions, such clean room air, surrounding structure 290. In other implementations, after the removal of sacrificial materials 212 and 214, structure 290 may be moved to a subsequent processing step without breaking the vacuumed conditions inside the processing tool.

Referring to flowchart 100 of FIG. 1, action 191 includes forming overlying plugs to fill the release holes in the sealing layer. The result of action 191 is illustrated by reference to FIGS. 2L-i and 2L-ii. FIG. 2L-i illustrates a top view of capping layer 220 having overlying plugs 219a through 219h filling release holes 216a through 216h in sealing layer 209e after completion of action 191 in flowchart 100 of FIG. 1, according to one implementation of the present disclosure. FIG. 2L-ii illustrates exemplary cross-sectional view of structure 291 after completion of action 191 in flowchart 100 of FIG. 1.

As shown in FIG. 2L-ii, structure 291 includes capping layer 220 having overlying plugs 219a through 219h filling release holes 216a through 216h in sealing layer 209e and barrier dielectric layer 215. Release holes 216a through 216h are plugged and sealed by capping layer 220 having overlying plugs 219a through 219h under a controlled environment, such that lower chamber 218a and upper chamber 218b may be sealed at a desired pressure throughout the entire space formed by lower chamber 218a and upper chamber 218b. In one implementation, sealed lower chamber 218a and upper chamber 218b have substantially the same pressure. In one implementation, a gaseous chemistry, such as helium gas, may be filled inside of sealed lower chamber 218a and upper chamber 218b.

Suitable material for capping layer 220 having overlying plugs 219a through 219h may include polymeric material, dielectric material and metallic material. If an oxide or a metal is used for capping layer 220, then a physical vapor deposition (PVD) or a chemical vapor deposition (CVD) may be used for blanket oxide deposition or metal deposition. For example, a PVD of capping layer 220 can be carried out in a high vacuum, such that the sealed upper and lower chambers of the MEMS device may have an atmosphere pressure on the order of $10^{-6}$ Torr. Also, a CVD of capping layer 220 can be carried out in a mid-range vacuum, such that the sealed upper and lower chambers of the MEMS device may have an atmosphere pressure on the order of $20 \times 10^{-3}$ Torr. If a polymer is used as capping layer 220, capping layer 220 can be spin coated to seal and plug release holes 216a through 216h, while structure 291 is placed under a controlled environment, such as in clean room air, for example. In one implementation, structure 291 may be taken out of the processing tool, and placed in a cluster tool or another chamber during the deposition of capping layer 220 under a controlled environment. In another implementation, structure 291 may be placed into a deposition chamber during the deposition of capping layer 220 without breaking the vacuum conditions. In yet another implementation, structure 291 may stay in the processing tool during the deposition of capping layer 220.

Referring to flowchart 100 of FIG. 1, action 192 includes forming external contact pads for the top and bottom MEMS plates. The result of action 192 is illustrated by reference to FIG. 2M. As shown in FIG. 2M, structure 292 includes blanket dielectric layer 209f, conductive vias 204i, 204j, 204k and 204l, metal segments 203l, 203m and 203n, passivation layers 221 and 222. Blanket dielectric layer 209f is formed over sealing layer 209e and capping layer 220, and planarized by CMP, for example, to form a top planar surface. Blanket dielectric layer 209f may be formed of any suitable dielectric material, such as oxides or nitrides.

Conductive vias 204i and 204j electrically connect metal segment 203j to metal segment 203m, which may serve as an external contact pad for top MEMS plate 203g. Conductive vias 204k and 204l electrically connect metal segment 203k to metal segment 203n, which may serve as an external contact pad for bottom MEMS plate 207a. Also, metal segment 203i and metal segment 203l are connected through conductive vias. Metal segments 203l, 203m and 203n may be formed of different metals in metal layer M6. In one implementation, metal layer M6 is formed on the top surface of blanket dielectric layer 209f, and patterned to form metal segments 203l, 203m and 203n. Passivation layers 221 and 222 are deposited over metal segments 203l, 203m and 203n, and the top surface of blanket dielectric layer 209f. In one implementation, passivation layer 221 may be a silicon oxide layer, and passivation layer 222 may be a silicon nitride layer.

As shown in FIG. 2M, bottom MEMS plate 207a is electrically connected to metal segment 203n through metal segments 203e, 203h and 203k, and conductive vias 204a, 204b, 204c, 204d, 204e, 204f, 204k and 204l. Also, top MEMS plate 203g is electrically connected to metal segment 203m through metal segment 203j and conductive vias 204g, 204h, 204i and 204j. Thus, metal segments 203m and 203n can be used as external contact pads for top MEMS plate 203g and bottom MEMS plate 207a, respectively.

Figure 3:
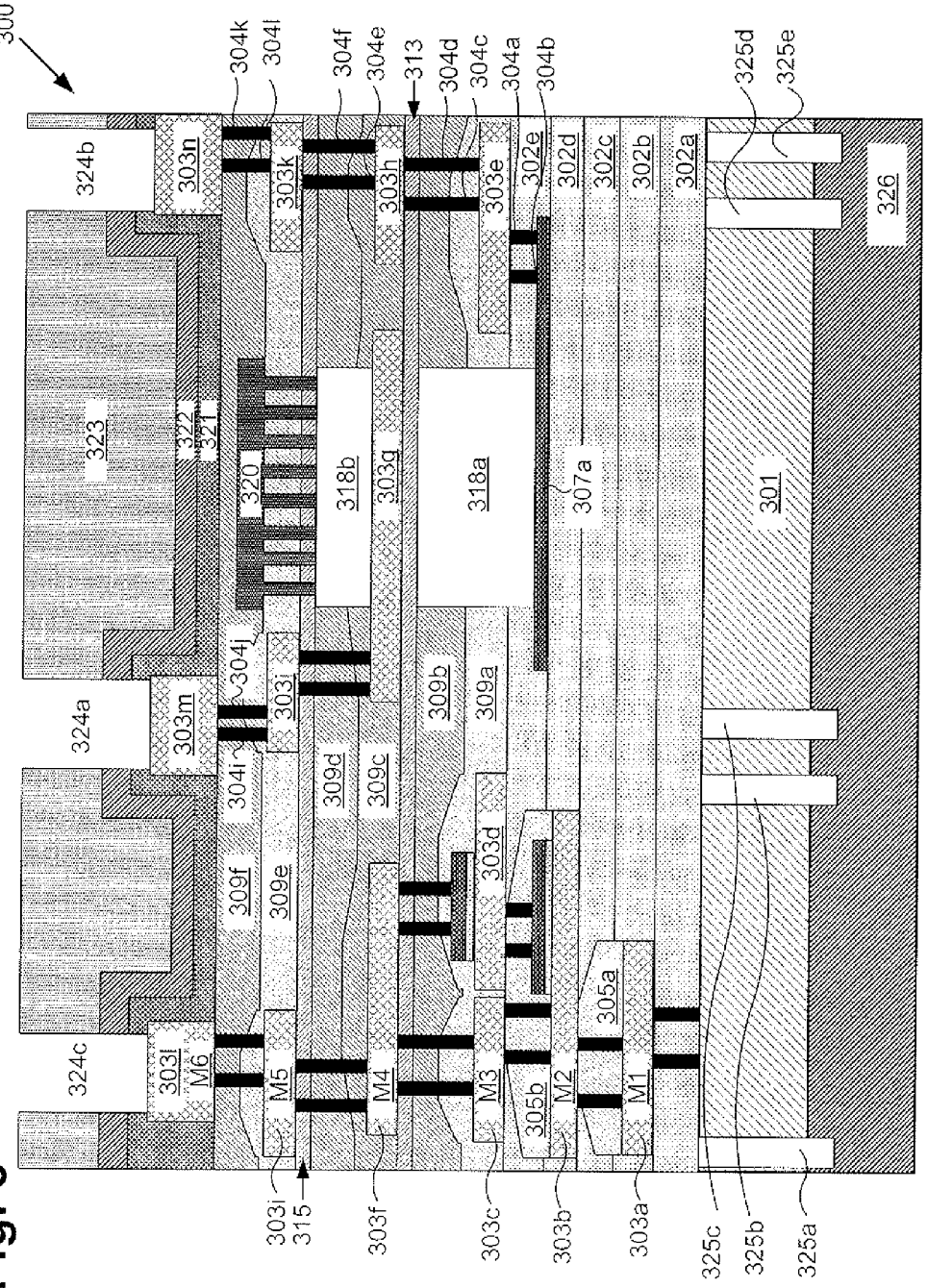
FIG. 3 illustrates a cross-sectional view of a portion of the wafer processed according to one implementation of the present application.

FIG. 3 illustrates a cross-sectional view of a portion of the wafer according to an implementation of the present application. In FIG. 3, similar numerals may refer to similar features in structure 292 of FIG. 2M. Structure 300 includes photoresist layer 323, openings 324a, 324b and 324c, deep trenches 325a, 325b, 325c, 325d and 325e, and layer 326. Photoresist layer 323 is formed over passivation layers 321 and 322. As shown in FIG. 3, openings 324a, 324b and 324c are formed by, for example, etching through photoresist layer 323, passivation layers 322 and 321, to expose a top surface of metal segments 303m and 303n for external electrical connection. In addition, deep trenches 325a, 325b, 325c, 325d and 325e may be optionally formed in semiconductor substrate 301 and layer 326, where layer 326 may be a buried oxide layer or a high resistivity layer. Deep trenches 325a, 325b, 325c, 325d and 325e may be used to isolate the area under the MEMS device from other semiconductor devices formed in structure 300.

As further shown in FIG. 3, a MEMS device may include bottom MEMS plate 307a, top MEMS plate 303g, lower chamber 318a, upper chamber 318b, sealing layer 309e, and capping layer 320. The MEMS device may be implemented as a resonator, a capacitor or a switch. For example, when a voltage or current is supplied between external contact pads 303m and 303n in structure 300, an electrostatic attractive force between bottom MEMS plate 307a and top MEMS plate 303g can be generated to attract and release top MEMS plate 303g, while bottom MEMS plate 307a is a fixed at the bottom of lower chamber 318a.

Figure 4A:
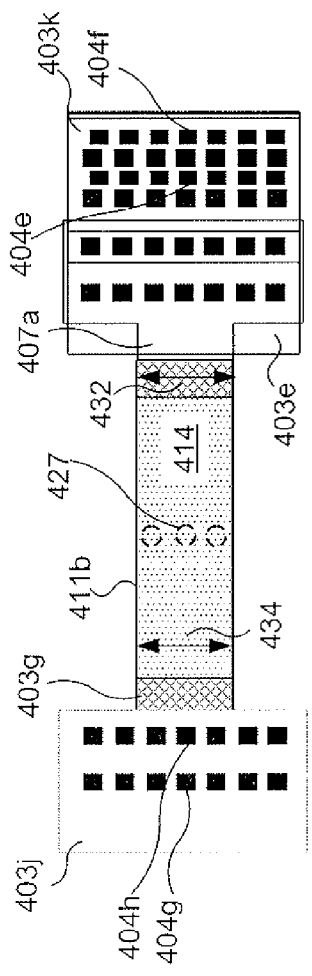
FIG. 4A illustrates a top view of a portion of the wafer processed according to an alternative implementation of the present application.
Figure 4B:
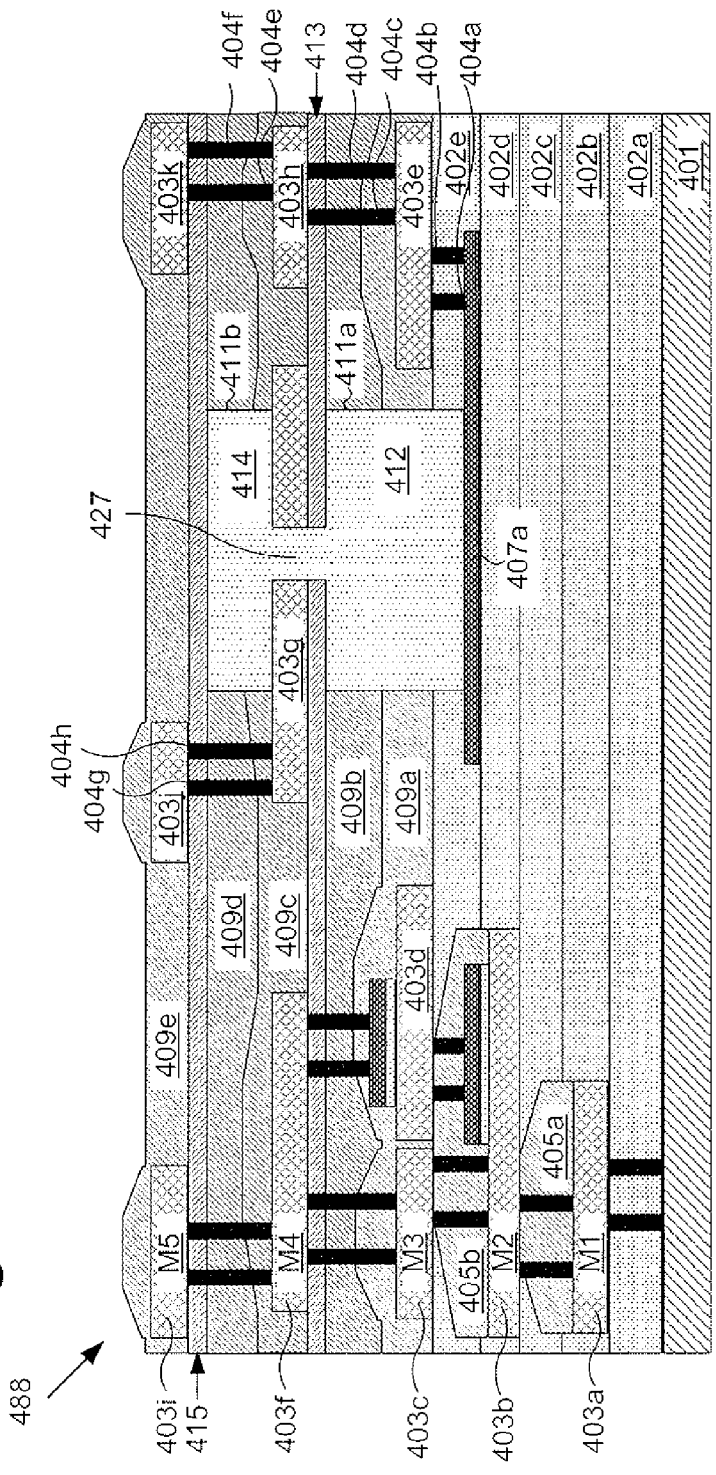
FIG. 4B illustrates a cross-sectional view of a portion of the wafer processed according to an alternative implementation of the present application.

Turning to FIGS. 4A and 4B, FIGS. 4A and 4B schematically show a variation of the implementation shown in FIGS. 2I-i though 2I-ii, where sacrificial materials 412 and 414 may be connected by one or more through-holes 427 in the center of top MEMS plate 403g. As shown in FIG. 4A, width 432 of top MEMS plate 403g is substantially the same as width 434 of opening 411b. In another implementation, width 432 of top MEMS plate 403g can be less than width 434 of opening 411b, such that sacrificial materials 412 and 414 can be in contact with each other in regions beyond width 432 of top MEMS plate 403g (e.g., similar to regions 217a and 217b in FIG. 2I-i), and in one or more through-holes 427. In other implementations, the connection between sacrificial materials 412 and 414 can be made at various locations within and/or beyond the interior of top MEMS plate 403g. The particular location may depend on the geometry, length, and scale of various MEMS devices.

The present inventive concepts utilize a single release process to simultaneously remove all sacrificial materials in a lower chamber and an upper chamber of a MEMS device, and seal the MEMS device with a controlled environment, thereby allowing the lower chamber and the upper chamber to have substantially the same or similar pressure and/or substantially the same or similar gaseous chemistry. The environment within the lower chamber and the upper chamber may be controlled and/or determined by deposition conditions prior to or during the deposition of the capping layer. In one implementation of the present disclosure, a method of fabricating and sealing a MEMS device can be conducted independently of the sacrificial material used in the lower chamber and the upper chamber and its method of removal. As such, the sealing the lower chamber and the upper chamber may be performed in the same process tool as the one used to perform the removal of the sacrificial, thereby enabling low cost and rapid implementation of MEMS fabrication.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A MEMS device comprising:
   a top MEMS plate and a bottom MEMS plate;
   a lower chamber between said bottom MEMS plate and said top MEMS plate, and an upper chamber between said top MEMS plate and a sealing layer;
   said top MEMS plate having at least one segment that is narrower than said bottom MEMS plate, thereby causing said lower and upper chambers to have a similar pressure;
   wherein said top MEMS plate is a first metal segment of a lower metal layer configured for interlayer connection, and said top MEMS plate is electrically coupled to a first metal segment of an upper metal layer through conductive vias;
   wherein said bottom MEMS plate is electrically coupled to a second metal segment of said lower metal layer, and to a second metal segment of said upper metal layer.

2. The MEMS device of claim 1, wherein overlying plugs fill release holes in said sealing layer.

3. The MEMS device of claim 2, wherein said overlying plugs comprise a material selected from the group consisting of a polymer, a dielectric and a metal.

4. The MEMS device of claim 1, wherein said lower and upper chambers are in a vacuum.

5. The MEMS device of claim 1, wherein said lower and upper chambers have similar gaseous chemistry.

6. The MEMS device of claim 5, wherein said lower and upper chambers comprise helium gas.

7. The MEMS device of claim 1, further comprising a MEMS dielectric between said top MEMS plate and said bottom MEMS plate.

8. A MEMS device comprising:
   a top MEMS plate and a bottom MEMS plate;
   a lower chamber between said bottom MEMS plate and said top MEMS plate, and an upper chamber between said top MEMS plate and a sealing layer;
   said top MEMS plate having at least one through-hole, thereby causing said lower and upper chambers to have similar pressure;
   wherein said top MEMS plate is a first metal segment of a lower metal layer configured for interlayer connection, and said top MEMS plate is electrically coupled to a first metal segment of an upper metal layer through conductive vias;
   wherein said bottom MEMS plate is electrically coupled to a second metal segment of said lower metal layer, and to a second metal segment of said upper metal layer.

9. The MEMS device of claim 8, wherein overlying plugs fill release holes in said sealing layer.

10. The MEMS device of claim 9, wherein said overlying plugs comprise a material selected from the group consisting of a polymer, a dielectric and a metal.

11. The MEMS device of claim 8, wherein said lower and upper chambers are in a vacuum.

12. The MEMS device of claim 8, wherein said lower and upper chambers comprise helium gas.

13. The MEMS device of claim 8, further comprising a MEMS dielectric between said top MEMS plate and said bottom MEMS plate.

14. A method of forming a MEMS device, said method comprising:
   forming a bottom MEMS plate;
   forming a top MEMS plate having at least one segment that is narrower than said bottom MEMS plate;
   forming a sealing layer over said top MEMS plate, said sealing layer having release holes for releasing sacrificial material situated under and over said top MEMS plate;
   forming overlying plugs in said release holes, thereby forming an upper chamber between said sealing layer and said top MEMS plate, and a lower chamber between said top MEMS plate and said bottom MEMS plate, and causing said upper and lower chambers to have similar pressure;
   wherein said top MEMS plate is a first metal segment of a lower metal layer configured for interlayer connection, and said top MEMS plate is electrically coupled to a first metal segment of an upper metal layer through conductive vias;
   wherein said bottom MEMS plate is electrically coupled to a second metal segment of said lower metal layer, and to a second metal segment of said upper metal layer.

15. The method of claim 14, wherein said overlying plugs comprise a material selected from the group consisting of a polymer, a dielectric and a metal.

16. The method of claim 14, wherein said lower and upper chambers are in a vacuum.

17. The method of claim 14, wherein said lower and upper chambers have similar gaseous chemistry.

18. The method of claim 14, further comprising forming a MEMS dielectric between said top MEMS plate and said bottom MEMS plate.

19. The method of claim 14, wherein said sacrificial material comprises a material selected from the group consisting of a polymer, silicon, silicon-germanium and a dielectric.

20. The method of claim 14, further comprising releasing said sacrificial material by isotropic etching.

* * * * *